(12) United States Patent
Mayolet et al.

(10) Patent No.: US 6,699,408 B2
(45) Date of Patent: Mar. 2, 2004

(54) METHOD OF MAKING A FLUORIDE CRYSTALLINE OPTICAL LITHOGRAPHY LENS ELEMENT BLANK

(75) Inventors: Alexandre M. Mayolet, Chartres (FR); Michael A. Pell, Fountainebleau (FR)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/122,266

(22) Filed: Apr. 11, 2002

(65) Prior Publication Data

US 2002/0132719 A1 Sep. 19, 2002

Related U.S. Application Data

(63) Continuation of application No. 09/835,451, filed on Apr. 16, 2001.

(30) Foreign Application Priority Data

May 9, 2000 (EP) .............................. 00401271

(51) Int. Cl.⁷ ............................... B29D 11/00

(52) U.S. Cl. ................ 264/1.23; 264/40.1; 264/406

(58) Field of Search .............. 264/1.23, 406, 264/40.1

(56) References Cited

U.S. PATENT DOCUMENTS

| | | | |
|---|---|---|---|
| 4,038,201 A | | 7/1977 | Hargreaves |
| 5,045,507 A | * | 9/1991 | Tran ............................ 501/40 |
| 6,226,128 B1 | * | 5/2001 | Shiozawa .................... 359/642 |
| 6,309,461 B1 | * | 10/2001 | Gianoulakis et al. ....... 117/206 |
| 6,320,700 B2 | * | 11/2001 | Shiozawa .................... 359/642 |
| 6,342,312 B2 | * | 1/2002 | Oba et al. .................... 428/696 |
| 6,350,310 B1 | * | 2/2002 | Gianoulakis .................. 117/2 |

FOREIGN PATENT DOCUMENTS

| | | |
|---|---|---|
| DE | 213514 | 9/1984 |
| EP | 0 919 646 | 6/1999 |
| EP | 0 995 820 A | 4/2000 |
| JP | 9[1997]-315893 | 12/1997 |

OTHER PUBLICATIONS

Mouchovski J., et al., Growth of Ultra–Violet Grade $CaF_2$ Crystals and Their Applications For Excimer Laser Optics, Journal of Crystal Growth, NL, , North Holland Publishing Co. Amsterdam, vol. 162, No. 1–02, Apr. 1, 1996, pp. 79–82.

Jiang: Growth and Properties of Scintillating Crystal $BaF_2$, Journal of Crystal Growth, NL, North Holland Publishing Co. Amsterdam, vol. 79, No. 1–3, Dec. 1986, pp. 720–722.

Dressler, L., et al., On the Inhomogeneity of Refractive Index of $CaF_2$ Crystals for High Performance Optics, Cryst. Res. Technol. 27, (1992) 3, pp. 413–420.

B. E. Kinsman et al., Preparation and Purification of Metal Fluorides for Crystals and Glasses, Materials for Optics and Electronics, vol. 5, (1995), pp. 45–51.

Dennis R. Cope, UV lasers require tough transmissive materials, Technology Guide: Laser Optics, Laser Foucs World, Jan. 1992, pp. 107–111.

(List continued on next page.)

*Primary Examiner*—Christopher A. Fiorilla
(74) *Attorney, Agent, or Firm*—Walter M. Douglas

(57) ABSTRACT

Method of making a high quality identifiable fluoride crystalline optical microlithography lens element blank for formation into an lens element of a microlithography system. The highly qualified fluoride crystalline characteristics of the fluoride optical lithography lens blank ensure its beneficial performance in the demanding microlithography manufacturing regime which utilizes high energy short wavelength ultraviolet laser sources. The fluoride crystalline optical lithography lens element blanks are comprised of multiple adjoining abutting crystalline subgrains with low boundary angles.

5 Claims, 11 Drawing Sheets

OTHER PUBLICATIONS

Donald C. Stockbarger, Artificial Fluorite, Journal of the Optical Society of America, vol. 39, No. 9, Sep. 1949, pp. 731–740.

R. L. Lambe et al., Mossbauer Studies of Oxygen–Stabilized $Eu^{2+}$ in $CaF_2$, Physical Review Letter, Vo. 36, No. 1, Jan. 5, 1976, pp. 43–49.

V. A. Sokolov, et al., Dependence on the refractive index in calcium fluoride crystals on their growing conditions, Optical Media, Sov J. Opt Technol., 56 (10) 1989 pp. 630–633.

Ioanna Matsouli, Study of the magneto–acoustic effects in $FeBO_3$ by synchrotron radiation diffraction imaging, Dept. of Physics, Univ. of Warwick, UK; Nov. 1998, pp. 6 and 10.

D. Keith et al., High ResolutionX–ray Diffractoemetry and Topography, 1998, Printed by Taylor and Francis Ltd., London, ISBN 0–8506–6758–5, pp. 221–224.

R. Rauch et al., VUV Absorption Spectra of Oxygenated $CaF_2$, Crystals, Phys. Stat. Sol. (a) 64, (181), p. K1 65–K1–68.

* cited by examiner

- 0.000
- 0.02500
- 0.05000
- 0.07500
- 0.1000
- 0.1250
- 0.1500
- 0.1750
- 0.2000
- 0.2250
- 0.2500

METHOD OF MAKING A FLUORIDE CRYSTALLINE OPTICAL LITHOGRAPHY LENS ELEMENT BLANK

This application is a continuation of U.S. patent application, Ser. No. 09/835,451, filed Apr. 16, 2001 entitled FLUORIDE CRYSTALLINE OPTICAL LITHOGRAPHY LENS ELEMENT BLANK, by Mayolet et al.

BACKGROUND OF THE INVENTION

The burden of the demands for improved performance of computers falls on the lithographic process used to fabricate the integrated circuit chips. Lithography involves irradiating a mask and focusing the pattern of this mask through an optical microlithography system onto a wafer coated with a photoresist. The pattern on the mask is thereby transferred onto the wafer. Decreasing the line-widths of the features on a given wafer brings about advances in performance. The enhanced resolution required to achieve finer line-widths is enabled by decreasing the wavelength of the illumination source. The energies used in lithographic patterning are moving deeper into the UV region. Optical components capable of reliable performance at these short optical microlithography wavelength are required. Few materials are known that have a high transmittance at 193 nm and 157 nm and do not deteriorate under intense laser exposure. Fluoride crystals such as calcium fluoride and barium fluoride are potential materials with high transmittance at wavelengths <200 nm. Projection optical photolithography systems that utilize the vacuum ultraviolet wavelengths of light at and below 193 nm provide desirable benefits in terms of achieving smaller feature dimensions. Microlithography systems that utilize vacuum ultraviolet wavelengths in the 157 nm wavelength region have the potential of improving integrated circuits and their manufacture. The commercial use and adoption of 193 nm and below vacuum ultraviolet wavelengths such as 157 nm has been hindered by the transmission nature of such deep ultraviolet wavelengths in the 157 nm region through optical materials. Such slow progression by the semiconductor industry of the use of VUV light below 175 nm such as the 157 nm region light has been also due to the lack of economically manufacturable blanks from optically transmissive materials and difficulties in manufacturing blanks which can be identified as high quality and qualified for their intended microlithography use. For the benefit of deep ultraviolet photolithography in the VUV 157 nm region such as the emission spectrum of the fluorine excimer laser to be utilized in the manufacturing of integrated circuits there is a need for FLUORIDE CRYSTALLINE OPTICAL LITHOGRAPHY LENS ELEMENT BLANKS that have beneficial optical and highly qualified crystalline properties including good transmission below 200 nm and at 193 nm and 157 nm and that can be manufactured and qualified economically. The present invention overcomes problems in the prior art and provides a means for economically providing high quality identifiable FLUORIDE CRYSTALLINE OPTICAL LITHOGRAPHY LENS ELEMENT BLANKS that can be used to improve the manufacturing of integrated circuits with vacuum ultraviolet wavelengths.

SUMMARY OF INVENTION

The invention comprises a high quality identifiable fluoride crystalline optical lithography lens element blank. The fluoride crystalline optical element blank includes crystalline subgrains which have crystalline subgrain structures. The fluoride crystalline optical element blank includes at least a first subgrain structure and a second subgrain structure. The second subgrain structure is adjacent to and abuts the first subgrain structure at a first defect boundary formed by dislocation defects. The first defect boundary has an adjacent first subgrain-second subgrain boundary angle. The first subgrain-second subgrain boundary angle is less than two minutes and the blank has an impurity level less than 1 ppm Pb by weight, less than 0.5 ppm Ce by weight, less than 2 ppm Na by weight and less than 2 ppm K by weight. The blank has a 157 nm internal absorption coefficient less than 0.0022/cm (base 10 absorption coefficient) and a 193 nm internal absorption coefficient less than 0.000431/cm (base 10 absorption coefficient), with an optical homogeneity less than 2 ppm and an average birefringence less than 2 nm/cm RMS with a maximum birefringence less than 5 nm/cm.

In a preferred embodiment the invention includes a method of making a fluoride crystalline optical lithography lens element blank. The method of making includes forming a fluoride crystalline melt, crystallizing the melt into a fluoride crystalline member preferably with a large dimension $\geq 200$ mm, and annealing the fluoride crystalline member. The method further includes qualifying the annealed fluoride crystalline member to provide a fluoride crystalline optical lithography lens element blank with a 157 nm internal absorption coefficient less than 0.0022/cm and a 193 nm internal absorption coefficient less than 0.00043/cm, a 205 nm lead absorption <0.23 $cm^{-1}$, an average birefringence less than 2 nm/cm with a maximum birefringence less than 5 nm/cm, and an optical homogeneity less than 2 ppm with a maximum surface subgrain disorientation boundary angle $\leq 2$ minutes.

DESCRIPTION

Figure 1:
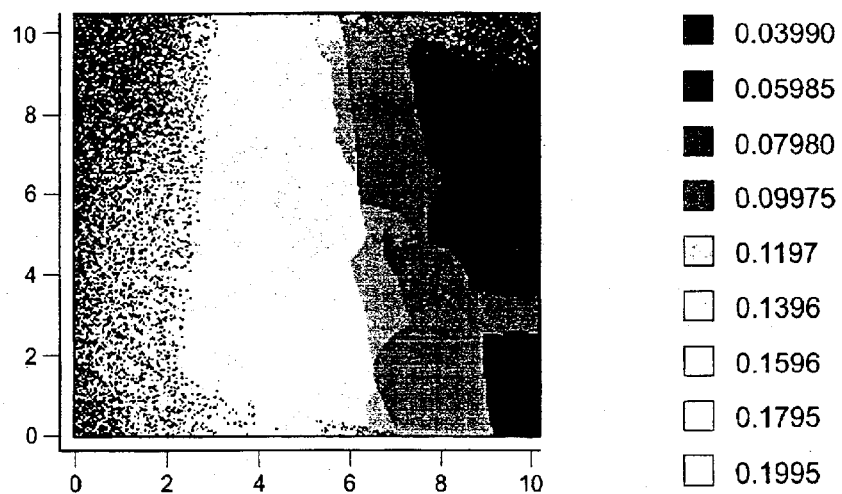
FIGS. 1–3 show the crystalline subgrains and structures of three samples of crystalline calcium fluoride with relative boundary angles in degrees.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

In an aspect of the invention, the fluoride crystalline optical lithography lens element blank has subgrains which have crystalline subgrain structures. In a preferred embodiment a first subgrain structure is adjacent to and abutted by a second subgrain structure at a first defect boundary formed by dislocation defects, with the boundary having an adjacent first subgrain-second subgrain boundary angle less than two minutes, with the blank having an impurity level by weight of <1 ppm Pb, <0.5 ppm Ce, <2 ppm Na, <2 ppm K, optical homogeneity less than 2 ppm, average birefringence <2 nm/cm RMS with maximum birefringence <5 nm/cm, and a 157 nm base 10 internal absorption coefficient less than 0.0022/cm with a 193 nm base 10 internal absorption coefficient <0.00043/cm. The blank has a third subgrain structure which forms a second defect boundary with an adjacent abutting subgrain structure. The second defect boundary has a second adjacent subgrain boundary angle which is also less than two minutes. Preferably the first subgrain structure or the second subgrain structure is the adjacent abutting subgrain structure which forms the <2 minutes boundary angle with this third subgrain structure. Preferably the first subgrain-second subgrain boundary angle is ≦ one minute and the second adjacent subgrain boundary angle ≦ one minute.

In a further preferred embodiment the fluoride crystalline lens element blank has a lead impurity level of less than 100 ppb by weight. Preferably the Na impurity level is <0.5 ppm and the K impurity level is <0.5 ppm, by weight. Preferably the blank has a 205 nm lead absorption <0.23 cm$^{-1}$ local extinction at 205 nm and has a 306 nm cerium absorption <0.35×10$^{-3}$ cm$^{-1}$ local extinction at 306 nm.

In a preferred embodiment the fluoride crystalline optical lithography lens element blank is a crystalline calcium fluoride optical lithography lens element blank. Preferably the crystalline calcium fluoride optical lithography lens element blank is free of an oxygen absorption peak within the wavelength range of 140 to 150 nm. Preferably the blank consists essentially of Ca and F.

In another embodiment the fluoride crystalline optical lithography lens element blank is a crystalline barium fluoride optical lithography lens element blank. Preferably the blank consists essentially of Ba and F.

In a preferred embodiment the fluoride crystalline optical lithography lens element blank has an average birefringence less than 1 nm/cm RMS with a maximum birefringence less than 2 nm/cm.

Preferably the fluoride crystalline optical blank has a large dimension surface with surface subgrains bounded by adjacent abutting subgrains with disorientation boundary angles in the range from >20 seconds to <2 minutes wherein the large dimension blank surface has at least three surface subgrains per cm$^2$. Preferably the large dimension surface has a surface area of at least 300 cm$^2$. Preferably the large dimension surface of the blank is circular, and most preferably has a diameter ≧200 mm. Preferably the large dimension surface circular blank has a diameter no greater than 400 mm. A blank large dimension diameter range of the invention includes from about 150 mm to 400 mm, preferably about 200 mm to 400 mm, and most preferably about 200 mm to 300 mm.

The crystalline fluoride blanks of the invention contain dislocation defects. A dislocation occurs when one part of the crystal lattice structure is translated relative to a neighboring part. Dislocations can be arranged in arrays to form subgrain boundaries. Subgrains are thus sections of the lattice bound by arrays of dislocations. The angle between adjacent subgrains is called the disorientation angle. As subgrain boundaries are only metastable thermodynamically, they represent areas of high stress in the crystal. In these zones, the local density of scattering centers differs from the bulk.

The local change in refractive index as a function of such stresses are related to the strain-optical coefficients $p_{11}$, $p_{12}$, and $p_{44}$ by the following expressions:

$$n_z - n = dn_z = -p_{11}(n^3/2)\epsilon$$

$$n_x - n = dn_x = -p_{12}(n^3/2)\epsilon$$

$$n_{z'} - n_{x'} = -p_{44}(n^3/2)\epsilon'$$

where n is the refractive index in the unstrained position and $\epsilon$ is the strain produced. The directions x, z, x', and z' correspond to the crystallographic directions [100], [001], [−110], and [110] respectively. $(p_{11}-p_{12})$ and $p_{44}$ are the Pockel coefficients for shear and $(p_{11}-2p_{12})$ is the Pockel coefficient for volume change.

The disorientation angle θ can be expressed as:

θ=b/l where b is the Burgers vector and l is the spacing of the dislocations.

In accordance with the invention synchrotron radiation is used to examine the local topography of a crystalline fluoride lens blank and measure θ. The synchrotron radiation source allows for the selection of radiation energy between 8 and 120 keV. The resolution is greatly increased with respect to other radiation sources owing to the lower wavelength of operation and low beam divergence. The measurement time is also greatly reduced as the brilliance of the source can be up to $10^{12}$ times greater than that of other radiation source such as an X-ray tube.

A series of rocking-curve measurements performed using synchrotron radiation shows that the average subgrain disorientation must not exceed 2' if the crystal is to have beneficial optical properties for lithography use.

Preferably the average subgrain disorientation is averaged over several 1 cm$^2$ areas with the spacing between such areas being no more than 4 cm.

The fluoride crystalline blank with the average subgrain disorientation less than 2' arc, is preferably obtained when the crystal growth rate using the conventional Bridgman technique is less than or equal to 3.5 mm/h and preferably for crystals with diameter >10 cm, the growth rate does not exceed 2.4 mm/h. The precise growth rate is inversely proportional to crystal diameter. We have observed that up to 40% of the crystals grown under such conditions will have average subgrain disorientation <2'. Crystals meeting this condition can be distinguished based on the diffractometric technique described herein. Such crystals will have <2 ppm optical homogeneity.

Figure 2:
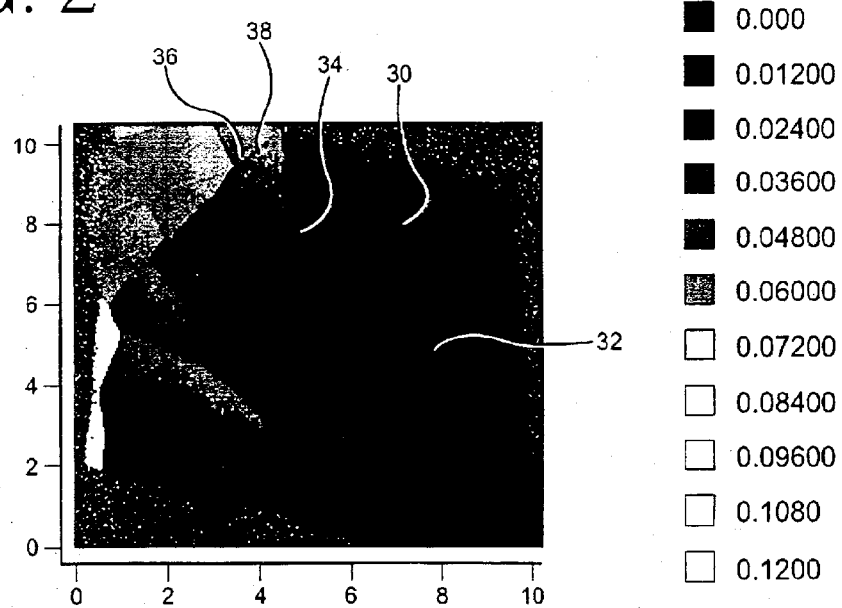
Figure 3:
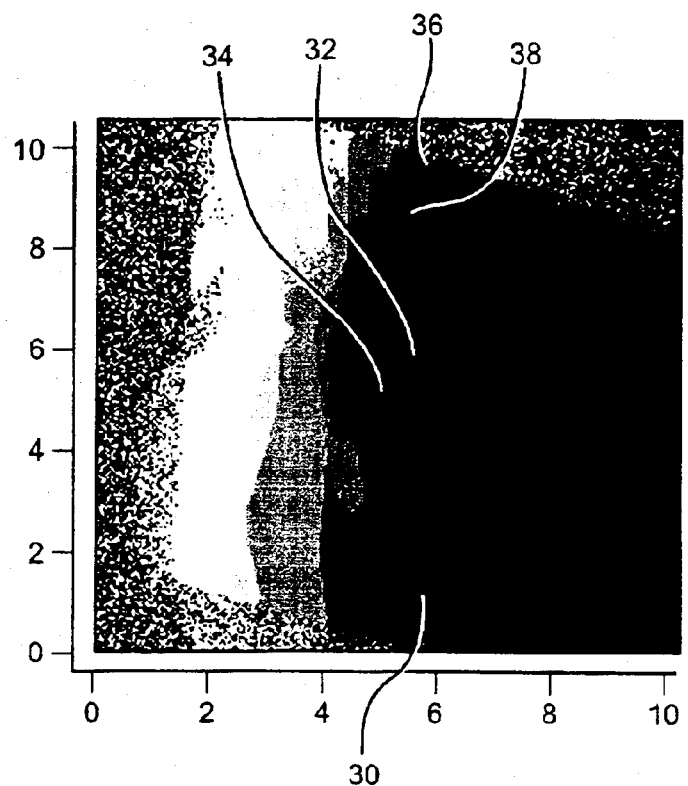
Figure 3:
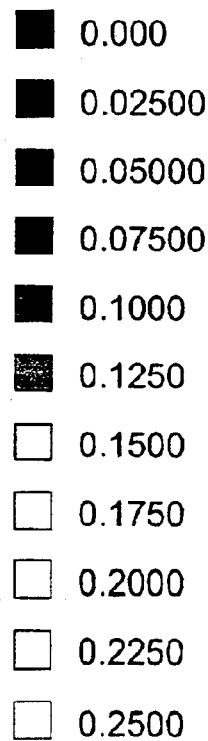
Figure 4A:
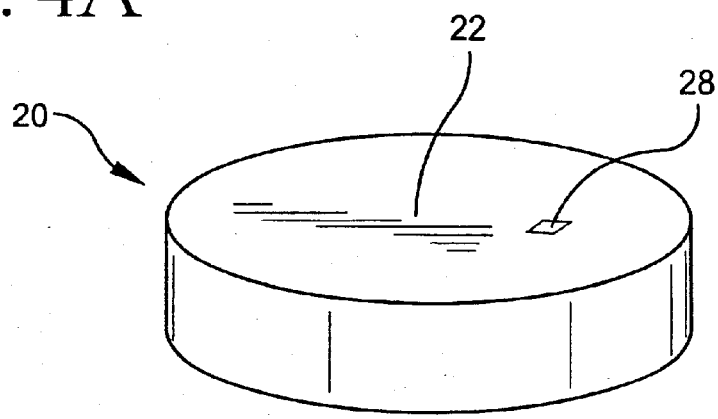
FIG. 4a depicts a fluoride crystalline optical lithography lens element blank.
Figure 4B:
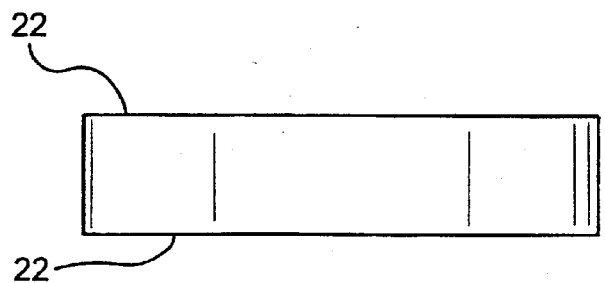
FIG. 4b is a side cross-section view of a blank.
Figure 4C:
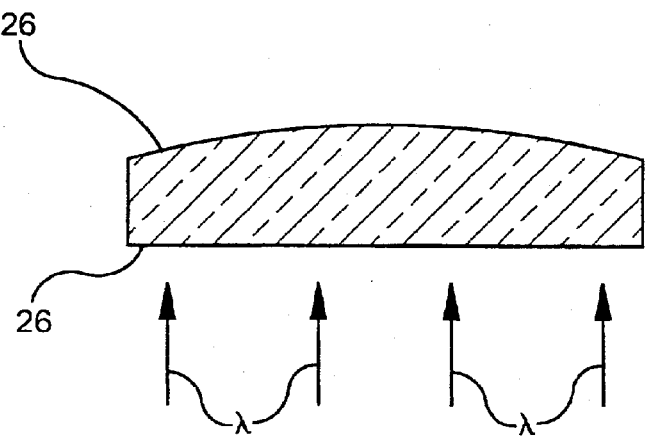
FIG. 4c is a side cross-section view of a lens element formed from the blank of FIG. 4b.

FIGS. 1–3 show the crystalline subgrains and structures of three samples of calcium fluoride crystalline optical lithography lens element blanks. FIG. 4a depicts a fluoride crystalline optical lithography lens element blank 20 with a large dimension surface 22. FIG. 4b is a side cross-section view at blank 20 which is a fluoride crystalline optical lithography lens element blank disk with the diameter being the large dimension of the blank and which provides large dimension surface 22. As depicted in FIG. 4b to FIG. 4c, the fluoride crystalline optical lithography lens element blank 20 is finished into fluoride crystalline optical lithography lens element 24 for focusing photons of wavelength less than 200 nm in a photolithography machine/process. The large dimension of lens 24 originates in the large dimension of blank 20, and the large dimension surface 22 of blank 20 is formed into an optical surface 26 which manipulates and optically operates on the lithography radiation. FIGS. 1–3 are photomicrographs of the subgrain structure of one centimeter square sections of three separate calcium fluoride blanks. As depicted in FIG. 4a by square sample surface 28, the subgrain structure photomicrographs of FIGS. 1–3 are taken from the surface of the fluoride crystalline blank. FIGS. 1–3 are the results of rocking curve measurements of the crystalline sample surface utilizing synchrotron radiation at the European Synchrotron Radiation Facility in Grenoble, France. The highly collimated, focused, in-phase, intense synchrotron radiation beam was used to expose the square centimeter sample area to synchrotron radiation. The synchrotron radiation diffracted by the sample was measured by a radiation detection camera which provided these two dimensional images (diffracted synchrotron radiation measured as a function of crystal position). In FIGS. 1–3, the crystalline subgrain structures of the blanks are disclosed with the use of the Relative Boundary Angle Keys which give boundary angle of adjacent subgrain structures in degrees. As shown in FIG. 3, Sample C has a first subgrain structure 30 and a second adjacent abutting subgrain structure 32, with first defect boundary 34 between subgrain structures 30 and 32 having a subgrain boundary angle of about 1.5 minutes. As shown in FIG. 3, Sample C, includes at least a third subgrain structure such as third subgrain structure 36 which forms a second defect boundary 38 with adjacent abutting subgrain structure 32, with defect boundary 38 having a second adjacent subgrain boundary angle of about 1.5 minutes. As shown in FIG. 2, Sample B has a first subgrain structure 30 and a second adjacent abutting subgrain structure 32 with first defect boundary 34 between subgrain structures 30 and 32 having a subgrain boundary angle of about 0.7 minutes. FIG. 2, Sample B includes third subgrain structures such as structure 36 which forms a second defect boundary 38 with adjacent abutting subgrain structure 30, with defect boundary 38 having a second adjacent subgrain boundary angle of about 0.7 minutes. Similarly FIG. 1, sample A shows adjacent abutting subgrain structures with defect boundaries having the preferred low adjacent subgrain boundary angles of the invention, which are less than two minutes and less than one minute.

Such crystalline subgrains and subgrain structures are preferred to insure a highly qualified fluoride crystalline optical lithography lens element blank for formation into a lithography lens and insure beneficially and desirable optical properties including low birefringence and high optical homogeneity in addition to minimal impurity induce crystalline defects and related impurity induced optical problems such as 157 mn and 193 mn absorption. Sample A blank had an average subgrain disorientation of 1.2 minutes and an optical homogeneity of 1.4 ppm. Sample B blank had an average subgrain disorientation of 0.7 minutes and an optical homogeneity of 1.1 ppm. Sample C blank had an average subgrain disorientation of 1.5 minutes and an optical homogeneity of 1.4 ppm. In a preferred embodiment of the invention the fluoride crystalline optical lithography lens element blank is comprised of large dimension surface subgrain boundary angles in the range from greater than one to less than two minutes.

Figure 5:
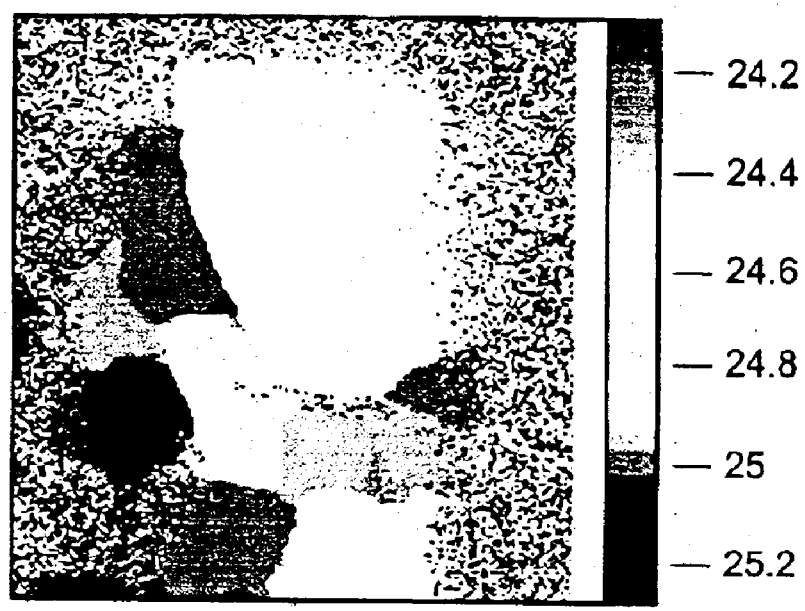
FIG. 5 shows a comparison sample of calcium fluoride subgrain structure with highly disoriented subgrains with relative boundary angles in degrees.

FIG. 5 shows a comparison sample of calcium fluoride with highly disoriented subgrains. The average disorientation dislocation defect boundary angles of the comparison sample of FIG. 5 was 22.2 minutes and the optical homogeneity was 8.3 ppm. The comparison of FIGS. 1–3 to FIG. 5 discloses the benefits of the preferred average disorientation boundary angle level less than two minutes, with the high disorientation levels of FIG. 5 subgrain structures resulting in a highly stressed crystalline structure with high levels of birefringence and homogeneity which make such unsuitable for microlithography applications.

Figure 6:
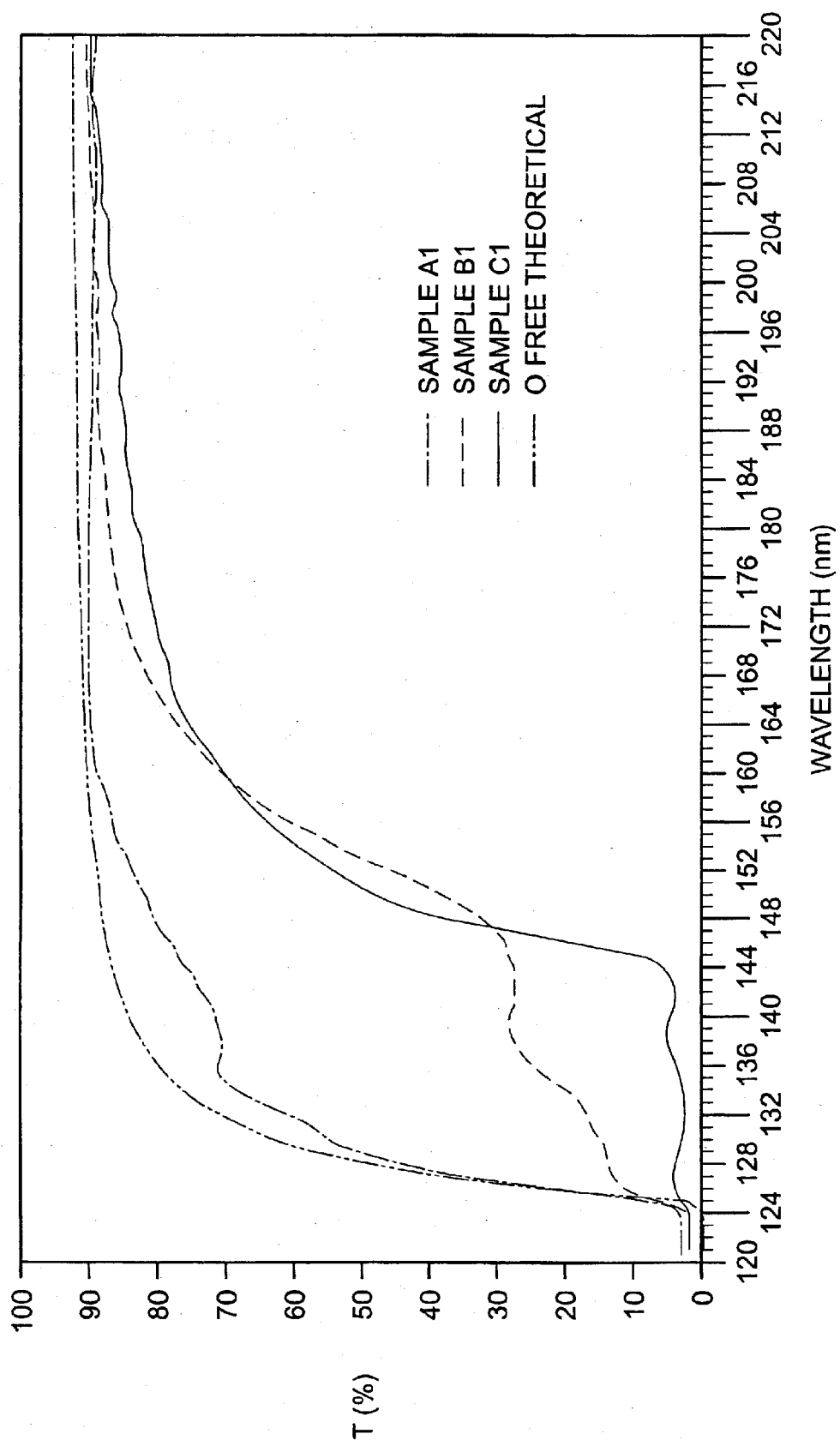
FIG. 6 shows the effect of oxygen on the transmission of 157 nm optical lithography light in crystalline calcium fluoride.

FIG. 6 shows the effect of oxygen on the transmission of 157 nm optical lithography radiation in crystalline calcium fluoride. FIG. 6 shows the VUV transmission through 50 mm path length samples of calcium fluoride crystals. Sample A1 had a low oxygen content, sample B1 had a medium oxygen content, and sample C1 had a high oxygen content. Such levels of oxygen content were obtained by using high, medium and low levels of oxygen scavenging lead fluoride in the crystalline melt to remove oxygen from the crystalline structures. A comparison of the spectrum of sample A1 with samples B1 and C1, show that low oxygen sample A1 is free of an oxygen absorption peak within the wavelength range of 140 to 150 nm with minimized absorption. Samples B1 and C1 show the detrimental effect of their oxygen absorption band in the 140 to 150 range to the transmission of 157 nm radiation.

Figure 7:
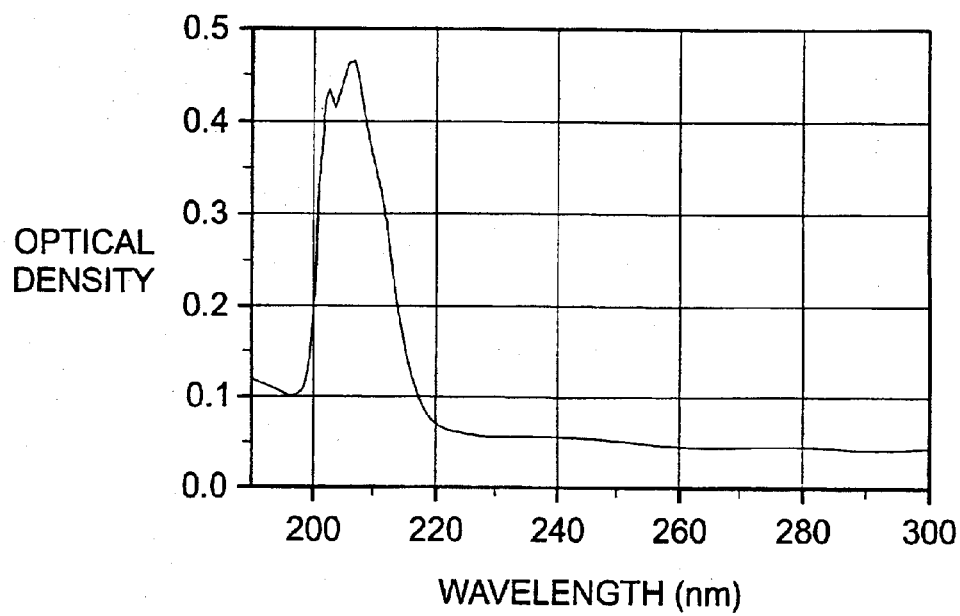
FIG. 7 shows the absorption spectrum from 190 nm to 300 nm of a 0.57 cm path length crystalline calcium fluoride sample with a Pb content of 2.16 ppm.
Figure 8:
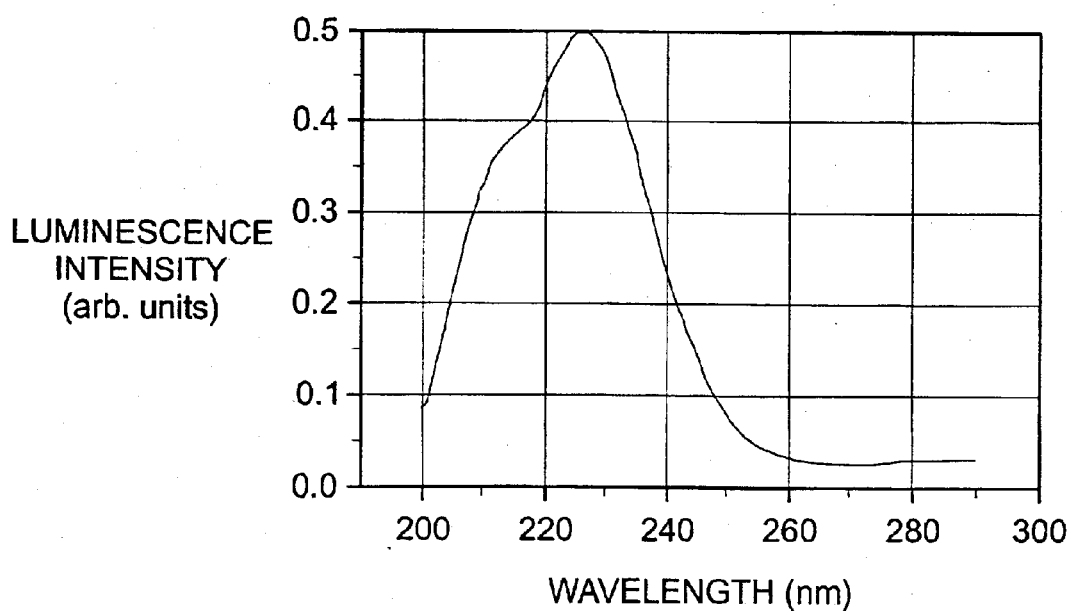
FIG. 8 shows the luminescence spectrum of the lead containing sample of FIG. 7, when excited by 203 nm light.

FIG. 7 and FIG. 8 show the effect of lead on the transmission of radiation of wavelength <300 nm in crystalline calcium fluoride. FIG. 7 shows the absorption spectrum from 190 mn to 300 nm of a 0.57 cm path length crystalline calcium fluoride sample with a Pb content of 2.16 ppm. The lead containing sample at FIG. 7 has a 205 nm lead absorption of 0.23 cm$^{-1}$/ppm at 205 nm. FIG. 8 shows the luminescence spectrum of the lead containing sample of FIG. 7, when excited by 203 nm light. FIG. 8 shows that the 203 nm excited sample has a luminescence intensity peak from 210 nm to 270 nm. The calcium fluoride crystalline optical blank of the invention preferably has a 205 nm lead absorption <0.23 cm$^{-1}$/ppm at 205 nm, more preferably <0.20 cm$^{-1}$. The calcium fluoride crystalline optical blank of the invention preferably is free of a 235 nm centered (210 nm to 270 nm) lead luminescence intensity peak when excited by 203 nm light. The crystalline optical element blank of the invention has a Pb impurity level less than 1 ppm, preferably less than 100 ppb Pb by weight. Such low lead levels ensure qualified performance of the crystalline optical lithography blank lens element with beneficially low absorption at below 220 nm wavelengths and avoidance of lead luminescence when excited.

Figure 9:
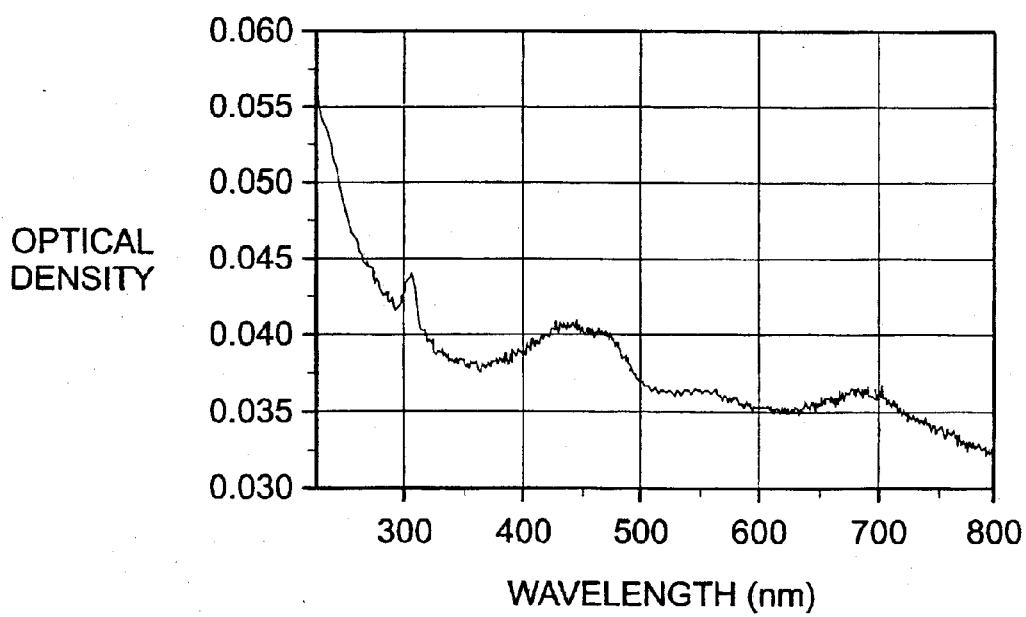
FIG. 9 shows the absorption spectrum of a 0.57 cm path length crystalline calcium fluoride sample with a Ce content of 0.73 ppm.

FIG. 7 shows the absorption spectrum from 190 nm to 300 nm of a 0.57 cm path length crystalline calcium fluoride sample with a Pb content of 2.16 ppm. The lead containing sample in FIG. 7 has a 205 nm lead absorption of 0.23 cm$^{-1}$/ppm at 205 nm. FIG. 8 shows the luminescence spectrum of the lead containing sample of FIG. 7, when excited by 203 nm light. FIG. 9 shows the effect of cerium on the below 350 nm transmission of light in crystalline calcium fluoride. FIG. 9 shows the absorption spectrum of a 0.57 cm path length crystalline calcium fluoride sample with a Ce content of 0.73 ppm. The 0.73 ppm Ce containing sample of FIG. 9 has a 306 nm Ce$^{+3}$ cerium absorption of $7 \times 10^{-3}$ cm$^{-1}$/ppm local extinction at 306 nm. The calcium fluoride crystalline optical lithography blank of the invention preferably has a 306 nm cerium absorption $<0.35 \times 10^{-3}$ cm$^{-1}$ at 306 nm. The crystalline optical element blank of the invention has a Ce impurity level less than 0.5 ppm.

Figure 10:
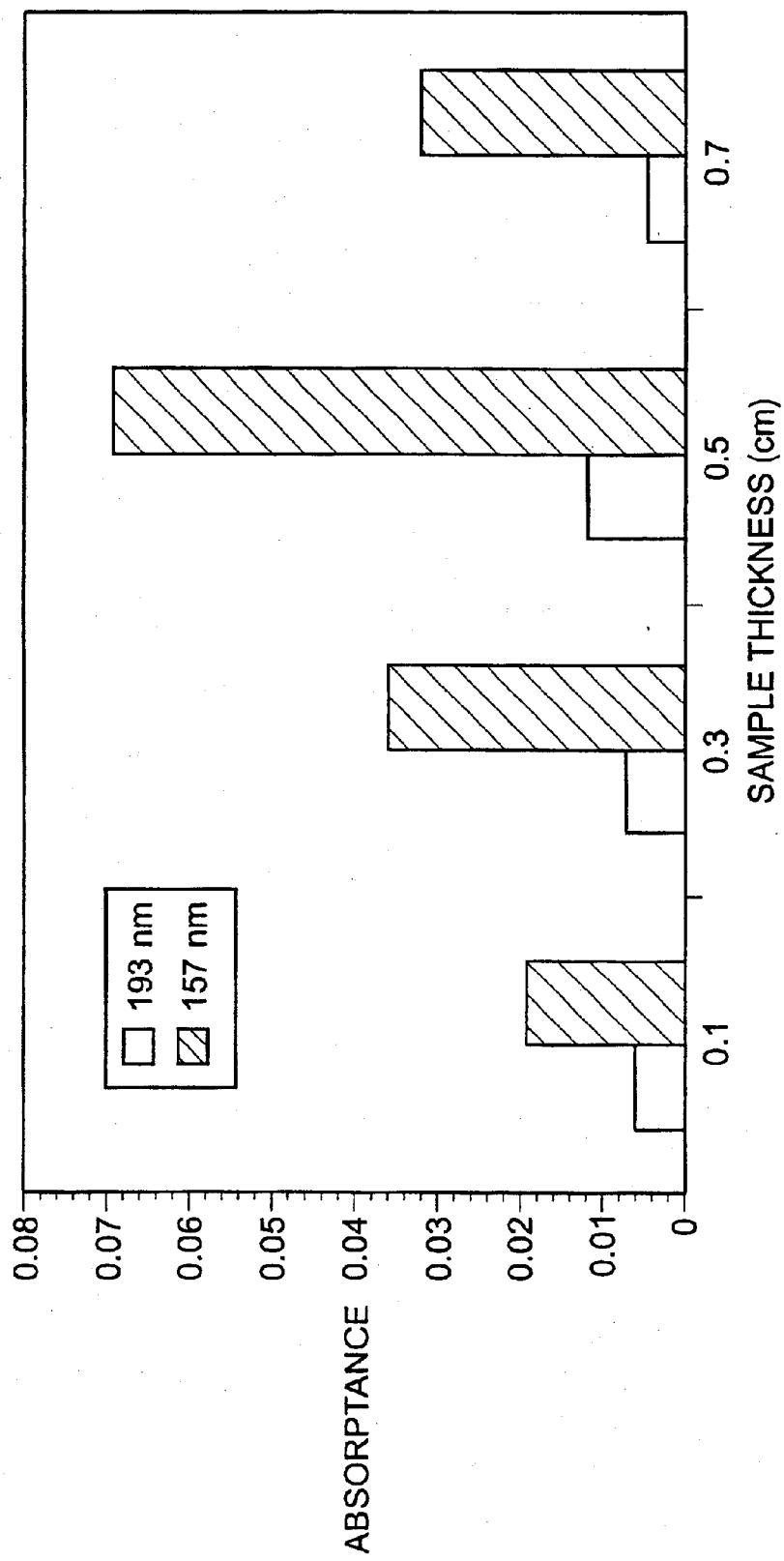
FIG. 10 is a comparison of 193 nm and 157 nm absorbance of crystalline calcium fluoride samples.

FIG. 10 is a comparison of 193 nm and 157 nm absorptance of crystalline calcium fluoride samples and shows that the determination of transmission of 193 nm and 157 nm lithography light is important for fluoride crystalline optical lithography lens element blanks. From left to right in FIG. 10, the first three sample thickness were taken from a single calcium fluoride blank, and the fourth sample was taken from a different calcium fluoride blank. FIG. 10 shows that absorptance at both 193 nm and 157 nm is important and that a measurement of 193 nm absorptance should not be used to indicate the 157 nm transmission properties of the calcium fluoride crystalline optical lithography lens element blank. The crystalline optical element blank of the invention has a 157 nm absorption coefficient less than 0.0022/cm base 10 absorption coefficient and a 193 nm absorption coefficient less than 0.00043/cm base 10 absorption coefficient.

The factors that dictate whether a given crystalline fluoride sample will satisfy the stringent optical lithography demands include its purity and crystal quality. The fluoride crystals are preferably grown by the Stockbarger-Bridgman method. This method involves lowering a crucible of molten material through a sharp temperature gradient. If the crystallization front is static, beneficial crystals may be obtained. As $CaF_2$ has a very low thermal conductivity (9.71 W/m·K at 311 K) and a high melting point (1418° C.), large diameter crystals of calcium fluoride are difficult to grow.

Preferably the invention includes a method of making a fluoride crystalline optical lithography lens element blank. The method includes forming a fluoride crystalline melt, crystallizing the melt into a fluoride crystalline member with a large dimension ≧200 mm, annealing the fluoride crystalline member, and qualifying the annealed fluoride crystalline member to provide a fluoride crystalline optical lithography lens element blank with a 157 nm internal absorption coefficient less than 0.0022/cm base 10 and a 193 nm internal absorption coefficient less than 0.00043/cm base 10, a 205 nm lead absorption less than 0.23 $cm^{-1}$ local extinction at 205 nm, a 306 nm cerium absorption less than $0.7 \times 10^{-3}$ $cm^{-1}$ local extinction at 306 nm, an average birefringence less than 2 nm/cm with a maximum birefringence less than 5 nm/cm, and an optical homogeneity less than 2 ppm with an average surface subgrain disorientation boundary angle not exceeding two minutes. Preferably forming the melt includes melting a high purity calcium fluoride raw material having by weight impurity levels of: less than or equal to 1 ppm Li, less than or equal to 3.3 ppm Na, less than or equal to 3.8 ppm K, less than or equal to 0.5 ppm Mg, less than or equal to 19 ppm Sr, less than or equal to 0.5 ppm Ba, less than 0.2 ppm Sc, less than 0.2 ppm Y, less than 0.2 ppm La, less than or equal to 0.2 Gd, less than 0.2 ppm Yb, less than 0.2 ppm Ti, less than 0.2 ppm Cr, less than or equal to 4.2 ppm Mn, less than or equal to 0.4 ppm Fe, less than or equal to 0.2 ppm Co, less than 0.2 ppm Ni, less than or equal to 0.3 ppm Cu, less than 200 ppm O. Preferably the calcium fluoride raw material has less than or equal to: 0.5 ppm Na and 1 ppm K.

Annealing preferably reduces stress birefringence of the member, in that prior to annealing the member has a high birefringence and through annealing this birefringence is reduced to a low birefringence. Preferably the maximum annealing temperature is 1250 degrees C., and the member is slowly cooled over several days to reduce birefringence.

Preferably the calcium fluoride raw material Na impurity level <2 ppm, and more preferably <0.5 ppm. The raw material K impurity level <2 ppm, and more preferably <1 ppm. The raw material Ba impurity level is preferably ≦0.2 ppm. Preferably the Mn impurity level ≦0.6 ppm. Preferably the Fe impurity level <0.2 ppm.

Preferably forming a fluoride crystalline melt include providing at least one deoxygenated densified solid fluoride disk having a diameter ≧200 mm and melting the deoxygenated densified solid fluoride disk. In a preferred embodiment forming a calcium fluoride crystalline melt utilizes at least one deoxygenated densified solid fluoride disk with a diameter ≧200 mm. The densified calcium fluoride disk has a density preferably >3 grams/$cm^3$.

Oxygen is a particularly troublesome impurity in $CaF_2$ and other fluoride materials. Even if the $CaF_2$ material used for crystal growth is oxygen free, adventitious reaction with water ($CaF_2$ is hygroscopic), air, and any other oxygen sources present during manipulations inherent to crystal growth may result in a product that has an undesirable amount of oxide anions. To combat this deleterious impurity, starting materials are usually treated with a fluorinating source before and/or during the crystallization process. $PbF_2$ is a favored fluorinating agent as it is relatively easy to handle and is easily separated from $CaF_2$ owing to its much greater volatility. PbO, the product obtained upon fluorination, is also easily removed under vacuum during the crystal growth process.

High purity synthetic $CaF_2$ powder typically has a density of ca. 1.1 g/$cm^3$ whereas bulk crystals have a density closer to that expected based on the dimensions of the $CaF_2$ unit cell, namely 3.18 g/$cm^3$. Thus, when high purity raw material synthetic powder is used directly, a large volume of the crystallization chamber is wasted. As the crystallization process usually requires several weeks, this inefficient packing is particularly unfavorable, particularly when ⅔ of the crystallization chamber volume is wasted when low-density synthetic powder is used directly. Densification of inorganic solids is usually achieved by melting (fusion) or by pressing (often at elevated temperatures).

Preferably both purification and densification of $CaF_2$ high purity raw material powder is done in a single step and that does not involve any equipment additional to that required for the crystal growth process. The crystal growth procedure used involves a system of stacked interconnected graphite crucibles 90 capped by a reservoir crucible 100 (FIG. 11a).

In this technique synthetic $CaF_2$ raw material powder is intimately mixed with $PbF_2$. This powder is then loaded into the crucible stack which is heated under vacuum in the crystallization furnace 110 to a temperature above the melting point of $CaF_2$ for a time sufficient for the removal of all volatile lead compounds. The product obtained is preferably oxygen-free $CaF_2$ in the form of dense discs 80 with diameters greater than or equal to 200 mm (FIG. 11b). The process is repeated until enough discs 80 are accrued to proceed with efficient crystal-growth. An individual $CaF_2$ disc may be transferred to a different crucible 90 prior to crystal growth or it may be kept in its original crucible 90.

The reaction temperature for purification densification is will be kept at ca. 1500° C., a value that is above the melting point of $CaF_2$, does not introduce excessive thermal stress on the oven components of vacuum furnace 110, and is consistent with that used during the crystal-growth operation. A preferred amount of $PbF_2$ added to $CaF_2$ is about 2 wt. %, and in the range of 0.5 to 5 wt. % added $PbF_2$ fluorinating agent. It is possible for residual O sources to be present in the crystallization oven owing to improper cleaning, poor vacuum, degassing of components, and water absorption. It is therefore advisable to have a scavenging $PbF_2$ source present during the crystal growth process. This is implemented by filling one (or more) of the crucibles 90 with synthetic $CaF_2$ powder mixed intimately with $PbF_2$ instead of a dense $CaF_2$ disc (FIG. 11c); the $CaF_2$ present in the upper reservoir 100 will balance the wasted volume. Preferably the powder is added to the bottom crucible 90. $PbF_2$ can also be included in the upper reservoir 100. Preferably there is no direct contact between the $PbF_2$ added in the crystallization step in FIG. 11c with the discs 80 of FIG. 11b produced in the densification/purification step of FIG. 11a. Further contamination by impurities present in the $PbF_2$ and grinding is thus avoided. In the present invention, the $PbF_2$ added to the bottom crucible 90 and/or the upper reservoir 100 provides the source of gaseous fluorinating agent. The $CaF_2$ discs 80 are melted before crystal growth.

Figure 11A:
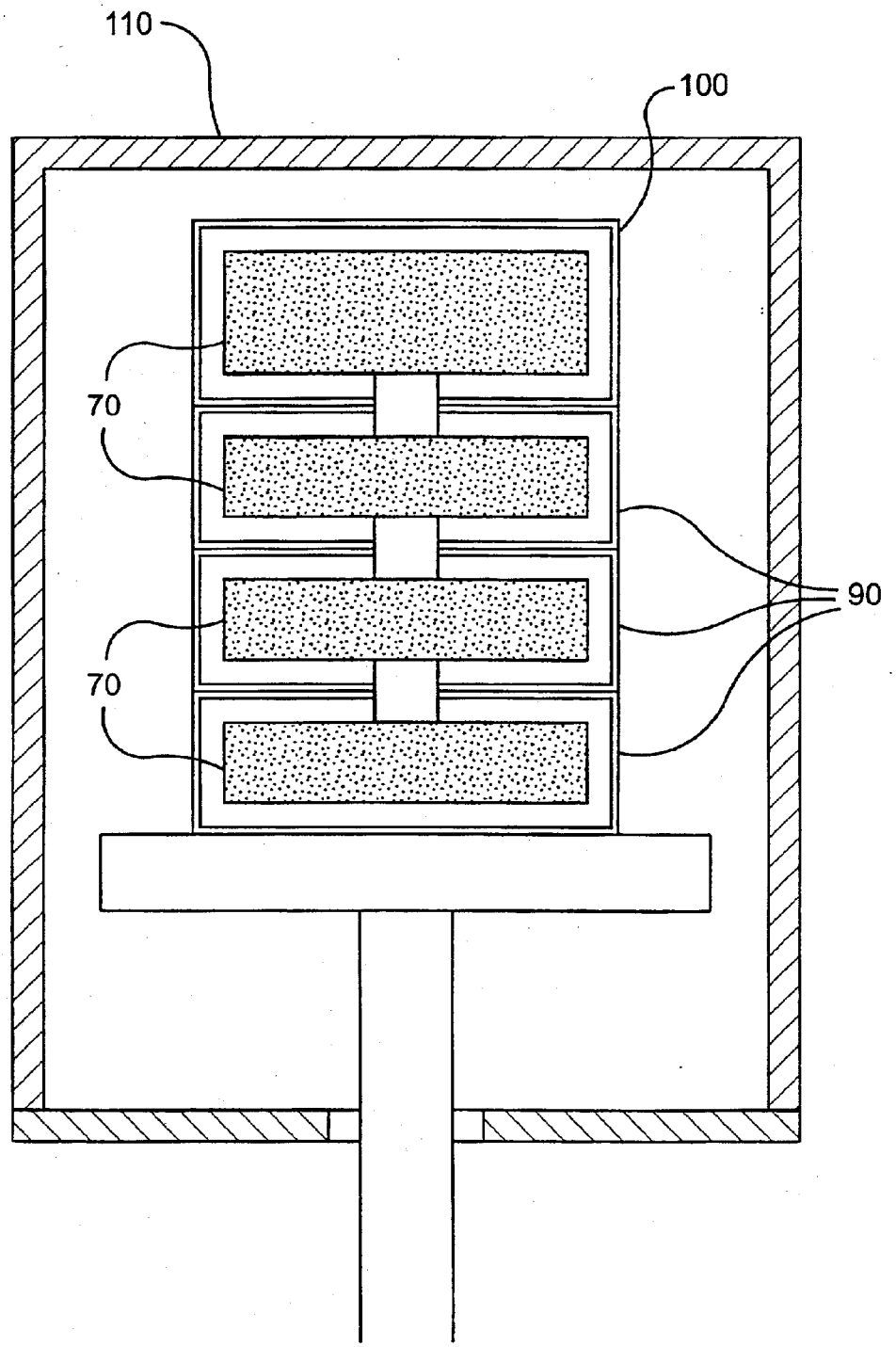
FIGS. 11a–c show an embodiment of the invention.
Figure 11B:
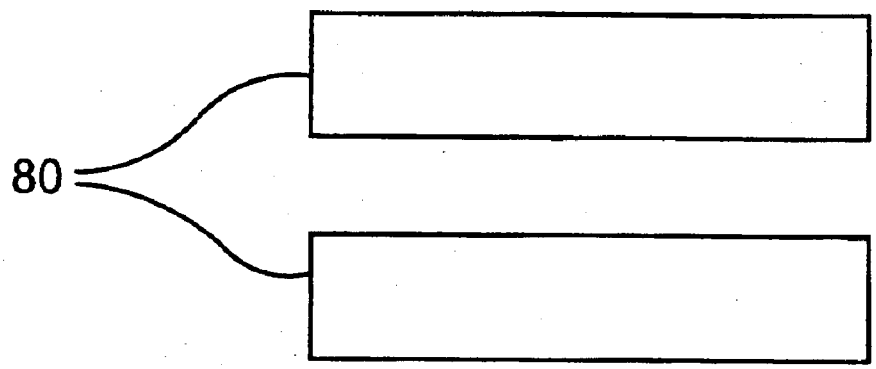
Figure 11C:
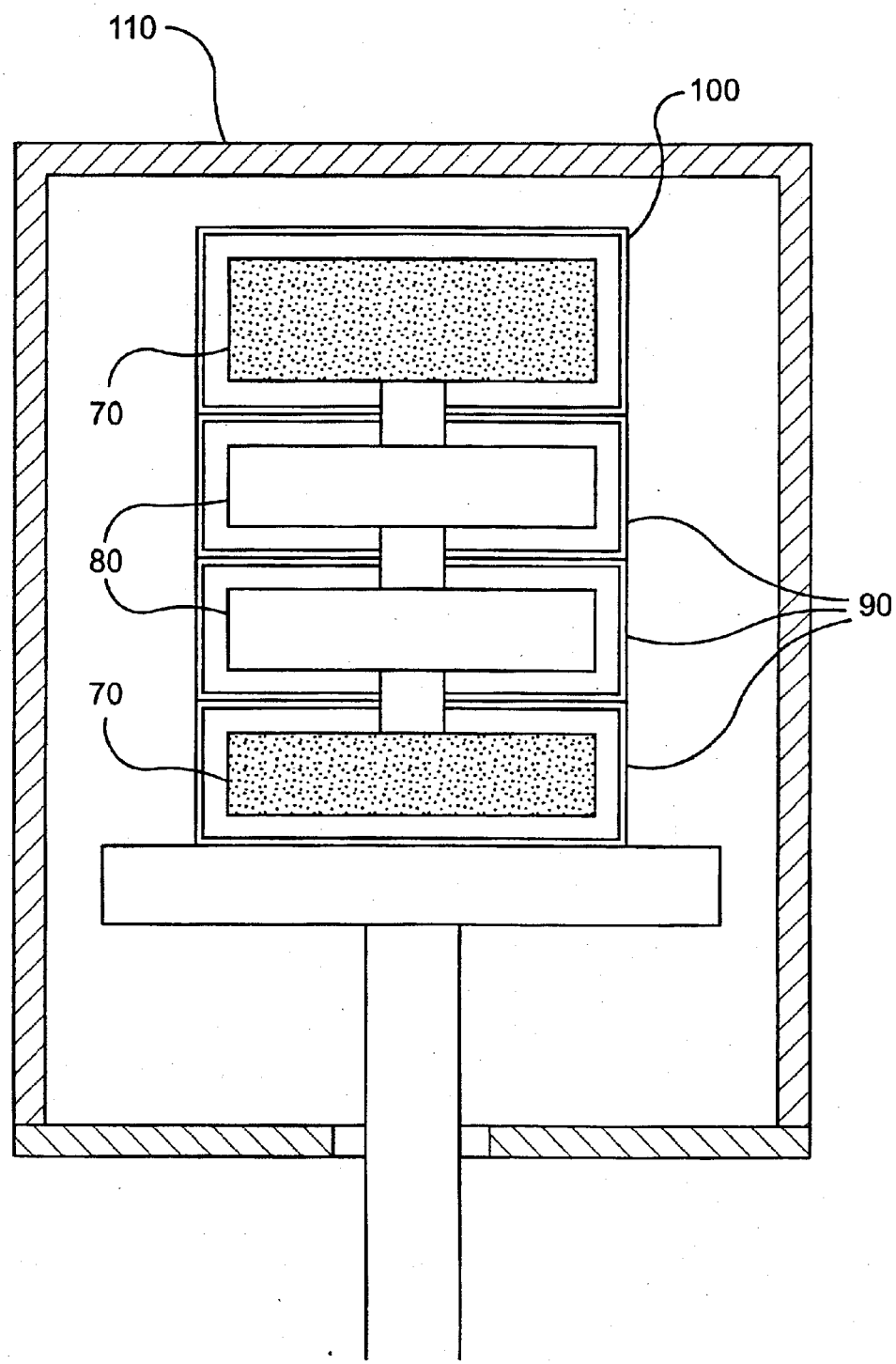

Preferably as shown in FIGS. 11a–c, a stack of three graphite crucibles with reservoir is used, the crucibles are interconnected by small holes, two dense oxygen-free $CaF_2$ disks are produced, the discs are used directly in the crystal growth process, and the bottom crucible and reservoir are filled with intimately mixed high-purity $CaF_2$ and $PbF_2$.

Impurities affect $CaF_2$ performance in many ways, with effects direct and indirect. Direct effects include those caused by elements that are optically active under the operation conditions. These effects include absorption and fluorescence. Indirect affects include distortions of the crystal lattice structure and the subgrains of the crystal caused by inclusion of elements of different size and/or charge. Such indirect effects lead to increases in scattering, birefringence, refractive index, laser damage, and linear attenuation coefficients. Inclusion of elements of different charges (i.e. a non +2 cation on the $Ca^{2+}$ site or a non −1 anion on the $F^-$ site) creates lattice defects, vacancies, and color centers.

Large diameter crystals (>200 mm) require very slow pulling speeds (such as about 2 mm/hr) preferably in the crystal growth rate range of about 0.5 to 3 mm/hour to ensure sufficient quality.

Preferably the calcium fluoride raw material Na impurity level <2 ppm, and more preferably <0.5 ppm. The raw material K impurity level <2 ppm, and more preferably <1 ppm. The raw material Ba impurity level is preferably $\leq 0.2$ ppm. Preferably the Mn impurity level $\leq 0.6$ ppm. Preferably the Fe impurity level <0.2 ppm.

Preferably forming a fluoride crystalline melt includes forming a calcium fluoride melt and qualifying includes analysis of oxygen absorption peaks within the wavelength range of 140 to 150 nm. Such analysis of oxygen absorption in the 140 to 150 nm wavelength range in accordance with FIG. 6 ensures beneficial optical lithography 157 nm light transmission.

Preferably qualifying includes measuring the absorption spectrum of the member from 200 nm to 220 nm for the 205 nm lead absorption peak and exciting the member with 203 nm excitation radiation and measuring the luminescence spectrum produced by exciting the member in accordance with FIG. 8.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. Method of making a fluoride crystalline optical lithography lens element blank, said method including:

forming a calcium fluoride crystalline melt, crystallizing said calcium fluoride crystalline melt into a fluoride crystalline member with a large dimension $\geq 200$ mm, annealing said fluoride crystalline member, analyzing said fluoride crystalline member for an oxygen absorption peak within the wavelength range of 140 to 150 nm to provide a qualified fluoride crystalline optical lithography lens element blank with a 157 nm internal absorption coefficient less than 0.0022/cm and a 193 nm internal absorption coefficient less than 0.00043/cm, a 205 nm lead absorption <0.23 $cm^{-1}$ local extinction, a 306 nm cerium absorption <$0.7 \times 10^{-3}$ $cm^{-1}$ local extinction, an average birefringence less than 2 nm/cm with a maximum birefringence less than 5 nm/cm, and an optical homogeneity less than 2 ppm with a surface subgrain disorientation boundary angle $\leq 2$ minutes.

2. A method as claimed in claim 1 wherein analyzing said fluoride crystalline member includes measuring an absorption spectrum of the member from 200 to 220 nm for a 205 nm lead absorption peak and exciting the member with a 203 nm excitation radiation and measuring a luminescence spectrum produced by exciting the member.

3. A method as claimed in claim 1 wherein forming a calcium fluoride crystalline melt includes melting a high purity calcium fluoride raw material having by weight impurity levels of $\leq 1$ ppm Li, $\leq 3.3$ ppm Na, $\leq 3.8$ ppm K, $\leq 0.5$ ppm Mg, $\leq 19$ ppm Sr, $\leq 5$ ppm Ba, <0.2 ppm Sc, <0.2 ppm Y, <0.2 ppm La, $\leq 0.2$ ppm Gd, <0.2 ppm Yb, <0.2 ppm Ti, <0.2 ppm Cr, $\leq 4.2$ ppm Mn, $\leq 0.4$ ppm Fe, $\leq 0.2$ ppm Co, <0.2 ppm Ni, $\leq 0.3$ ppm Cu, <200 ppm O.

4. A method as claimed in claim 1 wherein forming a calcium fluoride crystalline melt includes providing at least one deoxygenated densified solid fluoride crystalline disk having a diameter $\geq 200$ mm and melting the at least one deoxygenated densified solid fluoride crystalline $\geq 200$ mm diameter disk.

5. A method as claimed in claim 1 wherein analyzing said fluoride crystalline member includes exposing said fluoride crystalline member to a radiation source and detecting radiation diffracted by the fluoride crystalline member.

\* \* \* \* \*